US007959775B2

(12) United States Patent
Vukovic et al.

(10) Patent No.: US 7,959,775 B2
(45) Date of Patent: Jun. 14, 2011

(54) THERMAL STRESS-FAILURE-RESISTANT DIELECTRIC WINDOWS IN VACUUM PROCESSING SYSTEMS

(75) Inventors: Mirko Vukovic, Slingerlands, NY (US); Ronald Nasman, Averill Park, NY (US)

(73) Assignee: Tokyo Electron Limited, Tokyo (JP)

( * ) Notice: Subject to any disclaimer, the term of this patent is extended or adjusted under 35 U.S.C. 154(b) by 701 days.

(21) Appl. No.: 11/536,806

(22) Filed: Sep. 29, 2006

(65) Prior Publication Data

US 2008/0083615 A1  Apr. 10, 2008

(51) Int. Cl.
*C23C 14/00* (2006.01)
(52) U.S. Cl. .......... 204/298.02; 204/298.11; 204/298.18
(58) Field of Classification Search ............. 204/298.11, 204/298.2, 298.18
See application file for complete search history.

(56) References Cited

U.S. PATENT DOCUMENTS

| | | | | |
|---|---|---|---|---|
| 5,763,851 A | * | 6/1998 | Forster et al. ............ | 219/121.43 |
| 6,132,566 A | * | 10/2000 | Hofmann et al. ........ | 204/192.17 |
| 6,623,595 B1 | * | 9/2003 | Han et al. ................... | 156/345.1 |
| 6,719,886 B2 | * | 4/2004 | Drewery et al. ......... | 204/298.18 |
| 6,946,054 B2 | | 9/2005 | Brcka | |
| 2003/0159782 A1 | * | 8/2003 | Brcka ...................... | 156/345.48 |
| 2005/0011453 A1 | * | 1/2005 | Okumura et al. ......... | 118/723 E |
| 2006/0137821 A1 | * | 6/2006 | Howald et al. ........... | 156/345.48 |

* cited by examiner

*Primary Examiner* — Nam X Nguyen
*Assistant Examiner* — John Brayton
(74) *Attorney, Agent, or Firm* — Wood, Herron & Evans, LLP

(57) ABSTRACT

A ceramic window in an iPVD module is provided with features that reduce heating of the window as a result of metal film deposits on the window. Dielectric dissipation and resistive heating of the metal film are reduced by the features. Reducing of the window heating is provided by either shaping the window surface on the chamber side of the window or providing structurally floating features to block at least a portion of a conductive path from forming on the chamber side window surface. The shaping can produce contours that prevent current paths from being created in the forming metal film. In addition or in the alternative, texture on the chamber side surface of the window is provided to increase surface area and thereby reduce film thickness.

2 Claims, 3 Drawing Sheets

THERMAL STRESS-FAILURE-RESISTANT DIELECTRIC WINDOWS IN VACUUM PROCESSING SYSTEMS

This invention relates to vacuum processing systems, particularly plasma processing systems that couple RF energy through a dielectric window to excite a plasma within a vacuum processing chamber.

BACKGROUND OF THE INVENTION

In many vacuum processing systems, for example those used in the semiconductor manufacturing industry, a dielectric or ceramic window is employed in the wall of a vacuum chamber to provide transparency for the coupling of RF energy through the wall and into the chamber to support a plasma within the chamber. In many deposition systems, including ionized physical vapor deposition (iPVD) systems, and in some etch systems, metal vapor that is present in the chamber has a tendency to form an electrically conductive film on the inside of the window. The film allows electrical currents to be induced that heat the window, which in many cases causes the window to fail. Catastrophic failure of the dielectric window in some cases can result in loss of an expensive substrate, and in all cases results in costly maintenance and non-productive down-time of the processing equipment.

Better analysis of the causes of such failures and the better prevention of such failures are needed.

SUMMARY OF THE INVENTION

An objective of the present invention is to extend the life of a ceramic or dielectric window that tends to collect electrically-conductive film deposits in a plasma processing machine.

A more particular objective of the present invention is to reduce the heating effects on a dielectric window caused by the presence of metal film deposits of the window.

According to principles of the present invention, metal film thickness or metal film continuity are controlled by features on or adjacent the chamber side of a dielectric window in a plasma processing chamber.

According to certain embodiments of the invention, window heating is reduced by breaking the metal film current path by providing features at the window surface, and alternatively or in addition, by reducing the film thickness by increasing the window surface area.

The illustrated embodiments of the invention provide alternative methods of reducing the window heating, including forming overhang structure across the metal film current path on the window surface or reducing the film thickness by texturing the film surface to increase surface area.

These and other objects and advantages of the present invention will be more readily apparent from the following detailed description of illustrated embodiments of the invention.

BRIEF DESCRIPTION OF THE DRAWINGS

FIG. 1 is a schematic three-dimensional diagram of the plasma energy source for an iPVD processing machine.

FIG. 2 is a schematic diagram of the source of FIG. 1 to which is added a circuit diagram describing one form of mechanism by which a source window is heated.

FIG. 3 is a schematic diagram, similar to FIG. 1, illustrating one solution to window heating.

FIG. 4 is a schematic perspective diagram of a window feature for interrupting current that can cause window heating.

FIG. 5 is a schematic perspective diagram, similar to FIG. 4, of another window feature for interrupting current that can cause window heating.

FIG. 6 is a schematic perspective view of a vacuum chamber window illustrating one embodiment of surface texture for reducing film thickness to reduce window heating.

FIG. 7 is a schematic perspective view, similar to FIG. 6, of a window illustrating one embodiment of surface texture for reducing film thickness to reduce window heating.

DETAILED DESCRIPTION

One type of plasma processing apparatus that uses a dielectric or ceramic window in the wall of a vacuum processing chamber is an iPVD apparatus, an example of which is described in U.S. Pat. No. 6,719,886. The dielectric window in this apparatus provides RF transparency in the chamber wall to facilitate the generation of an inductively coupled plasma (ICP) in the chamber from a coil or other antenna outside of the chamber. Etching and deposition processes performed in the chamber can result in the formation of electrically-conductive, metal film formation on the inside of the window. Deposition baffles can be provided inside the window to retard and interrupt the film formation to prevent the film from reducing the coupling of RF power through the window. Some film eventually forms on the window, and supports induced current that can lead to the heating of the window through RF power being deposited into the window. The heating of the window can lead to a structural failure of the window as thermal stresses develop in the ceramic material of which the window is made.

Applicant has concluded that there are two primary RF power deposition mechanisms due to metal coating of the ceramic window in the iPVD module that produce heating of the window. The mechanisms include dielectric dissipation and resistive heating of the metal film. The currents in the metal film can be induced by capacitive coupling due to the differential voltage on the RF coil that is outside of the window and by induction from the fluctuating magnetic field from current in the coil. The dominant heating mechanism is believed to be dielectric dissipation, that is, heating by motion imparted to atoms in the dielectric window material as a result of currents induced in the film. About 20 watts of heating is attributed to this mechanism. Resistive heating as a result of current induced in the film or the dielectric material is believed to be negligible.

The ceramic vacuum window in the iPVD module is subject to thermal stresses and breakage when the deposited metal layer becomes continuous. Heat dissipation of about 100 watts in the central window region is sufficient to cause window breakage, which can be attributed to hoop (tensional) stresses along the window periphery due to the window expansion in the center.

Capacitive coupling between the coil and the metal film is one mechanism, by which a window is heated. FIG. 1 is a sketch of the three-dimensional RF coil outside of a dielectric window in the wall of the processing chamber of an iPVD apparatus. The window is shown with a thin conductive coat 15 of metal. A baffle 16 is shown having slotted openings 18 therethrough. The coil 14 is electrically floating, and will develop an RF voltage across its two ends 21 and 22, which will be of opposite polarity, that is, out of phase, and connect the coil 12 across an RF generator 24, typically operating at 13.56 MHz. While the baffle 16 substantially retards the buildup of film 15 on the window 14, metal gradually diffuses through the grill openings 18 of the baffle 16 to deposit the film 15 on the window 14.

Figure 1:
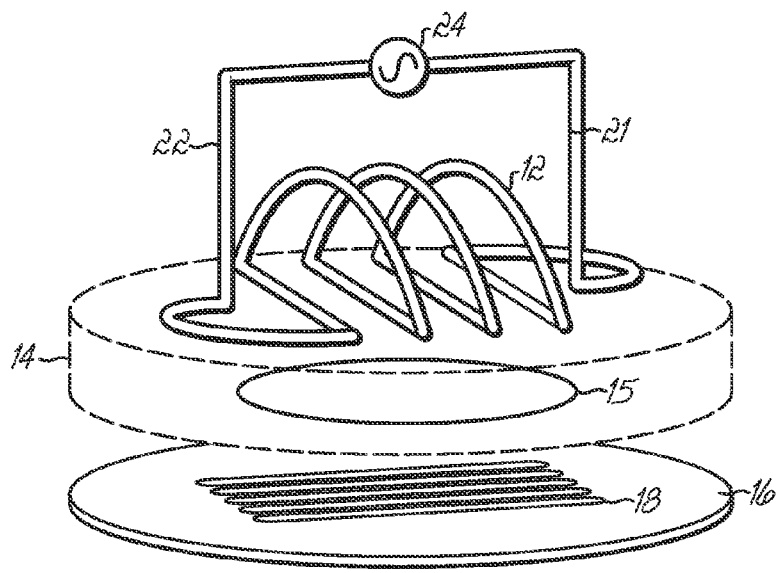
Figure 2:
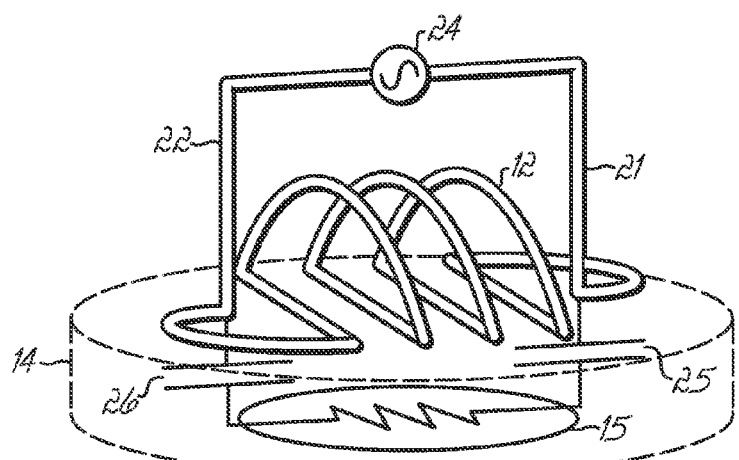

When the metal film 15 is deposited on the window 14, a circuit comprising of capacitive coupling between the coil ends and the metal film is formed. This circuit is shown on FIG. 2. The coil ends 21 and 22 couple capacitively to the metal film 15, as represented diagrammatically by capacitors 25 and 26, respectively. At one point in the RF cycle, the current flows from one coil end 21,22 capacitively through the window 14 to the metal film 15, then through the metal film 15, and then capacitively to the other end 22,21 or the coil 12. The current flow reverses when the polarity of the coil ends reverse. This presents the opportunity for both dielectric losses in the window 14 and resistive losses of the metal film 15.

From observation, the thickness of interest of the metal film 15 is in the range of from 1 to 5 microns, or typically around 2 microns. This thickness, where the film 15 is of copper, is much smaller than the skin depth, which is about 18 microns. Peak-to-peaks voltage on the coil can be about 9 kV. For an alumina window, calculations and modeling will show that power dissipation in the dielectric can be about 13 watts, with resistive power loss in the film 15 being about 4.5 watts for an exemplary configuration.

However, when the film is very thin such that when the film resistance is in the order of the capacitive impedance of the circuit, maximum power dissipation in the order of 100 watts could theoretically occur. But such high power loss is somewhat avoided by the use of a bridged baffle of the type described in U.S. Pat. No. 6,946,054. where the bridges prevent the circuit from closing while the deposits under the slots 18 of the baffle 16 are thin. That is, once a film builds up beneath the bridges, the rest of the coating is sufficiently thick to avoid large resistive power losses.

Induced current flows also result in power dissipation. If the film thickness were greater than the skin depth, current could loop around both sides of the film and result in power dissipation in the order of 1,000 watts. For thin films, current is much lower, and the dissipated power is lower, but nonetheless varies in proportion to the thickness cubed. So reduction of film thickness by 50% reduces heat load by about 87.5%. Inductive heating power can be estimated to be 1 watt for a 2 micron film, about 3.5 watts for a 5 micron film, and about 30 watts for a 10 micron film.

Accordingly, resistive heating of the metal film due to inductive heating, and due to capacitive coupling can become important for very thin and very thick films (much less than or much greater than one micron), dielectric dissipation is the dominant heating mechanism that accounts for window breakage.

Prevention of dielectric heating has been approached by attempts to reduce or eliminate metal deposition on the window through baffle design. Design of the window and source structure to eliminate the stress concentrations in the window can help the window withstand dielectric heating and improve the window lifetime. Use a higher thermal conductivity material for the window, for example, using aluminum nitride instead of aluminum oxide to provide a much higher thermal conductivity and smaller thermal expansion coefficient are also helpful in lessening window breakage. Furthermore, use of a structurally floating element that will become coated and heated instead of the window will also extend window life. Since such can element would be structurally floating, it would be less subject mechanical stresses.

Figure 3:
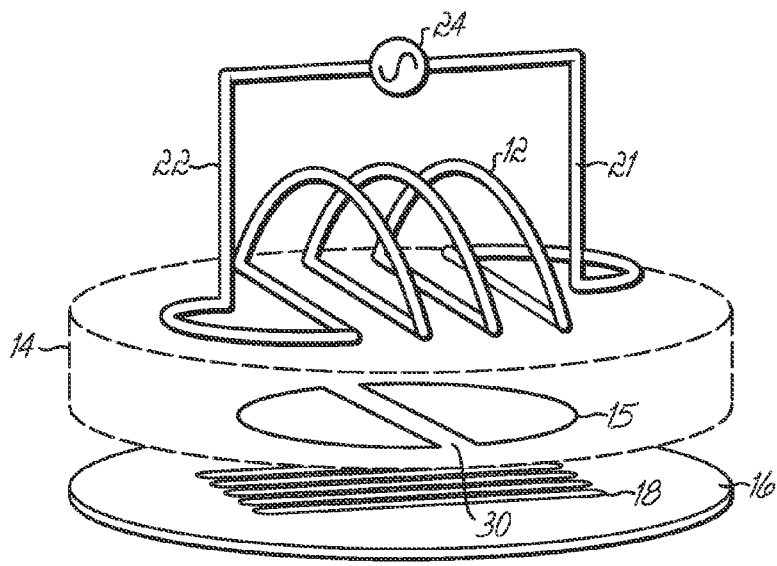

Dissipation losses and other losses due to currents in the metal film can be reduced by breaking the current path in the film or by reducing the film thickness. Breaking the current path can be achieved by splitting the metal film. The pattern of the film 15 can be controlled to that illustrated in FIG. 3. A break 30 in the film along a diameter of the window perpendicular to the coil axis will prevent the two film halves from connecting as the metal diffuses between the window and the baffle. A break 30 of about one centimeter is preferred.

The providing of a break 30 in the film 15 can be achieved by providing a self-shadowing feature on the chamber side of the window 14. One example of a self-shadowing feature is the raised feature 40 shown in an exaggerated form in FIG. 4, which projects a few millimeters into the chamber. This feature would lie along the window centerline and extend across most of its diameter, like the break 30 of FIG. 3. The feature 40 provides one or more overhangs 41 and 42. Metal would not deposit oil the underside of the overhang, breaking the conductive paths that might otherwise form parallel to the slots 18 in the baffle 16.

Figure 4:
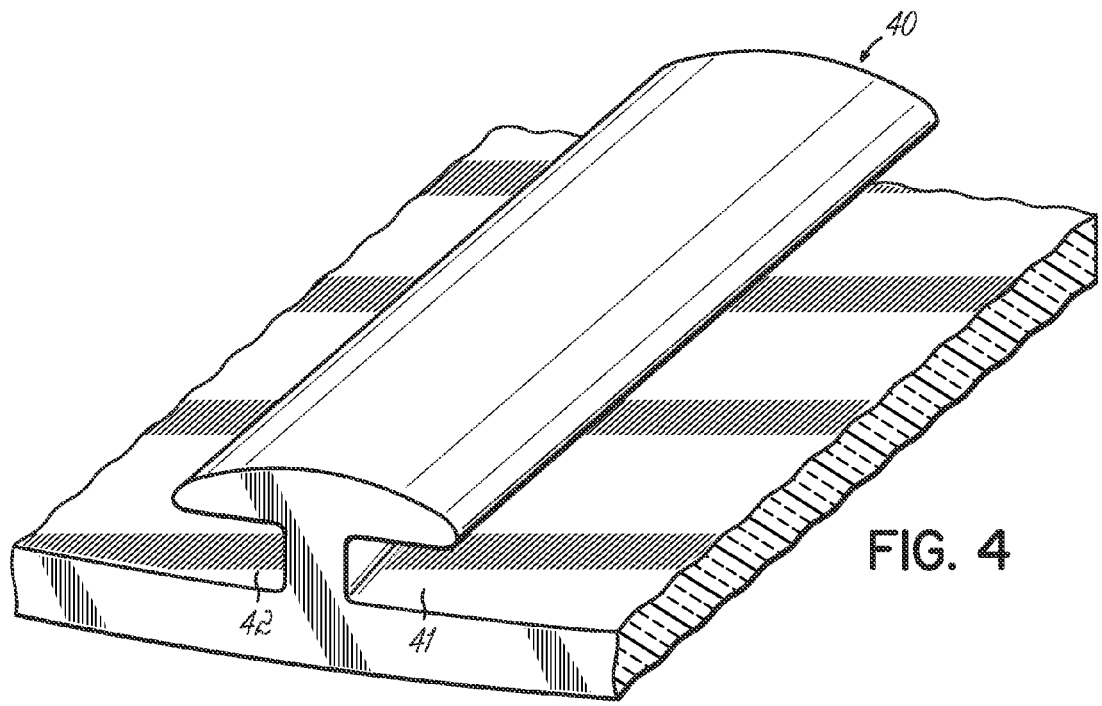
Figure 5:
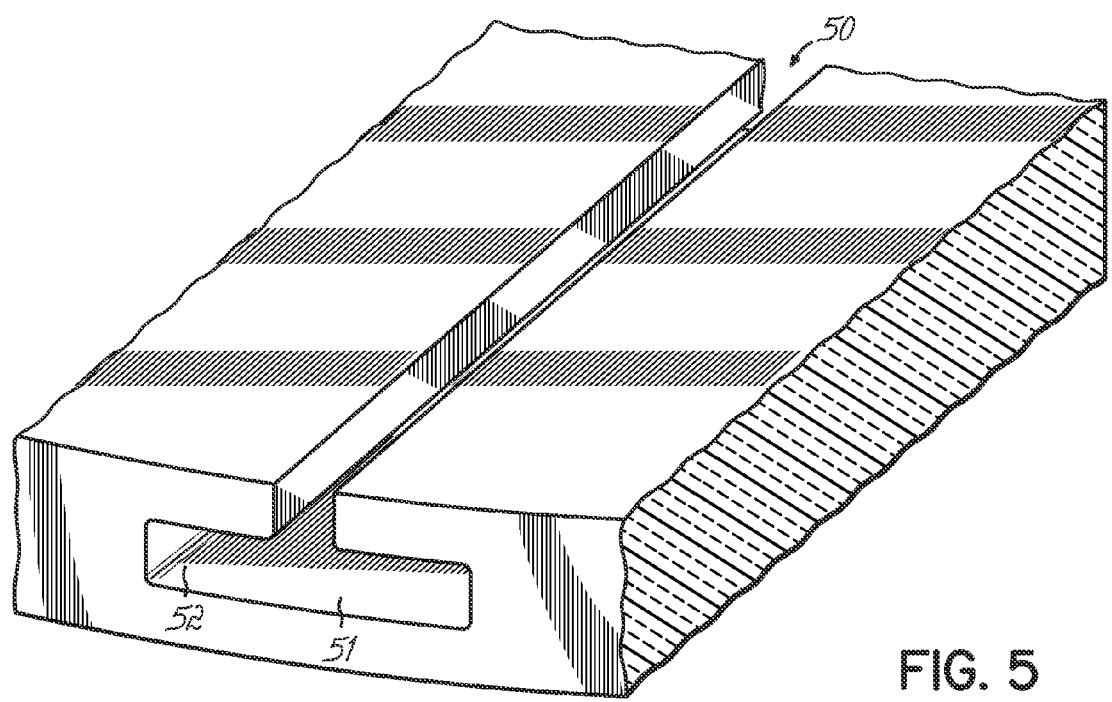

Another example of a self-shadowing feature is shown on FIG. 5. This feature is in the form of a groove 50, similar to an O-ring groove, formed diametrically across the window 14, oriented like the break 30 and feature 40 described above. As in the case of the raised feature 40, metal would not deposit on the underside of the overhangs 51 and 52. The features 40 and 50 in FIGS. 4 and 5 are diagrammatic. They are preferably constructed without sharp, abrupt edges that could increase the susceptibility of the window to breakage. As an alternative to the features 40 or 50 formed on the surface of the window 14, a strip of material, which can be structurally floating as noted above, between the window 14 and the baffle 16, can shadow the window 14 and provide the break in the film. This strip can be about 1 centimeter wide, parallel to the window 14 and perpendicular to the baffle slots 18, preferably along the center line of the window 14. Centimeter wide bridges across the baffle slots, preferably aligned along the centerline of the baffle, can also be used to provide shadowing to interrupt film deposits, but acceptable RF transparency must still be maintained in the baffle.

Figure 6:
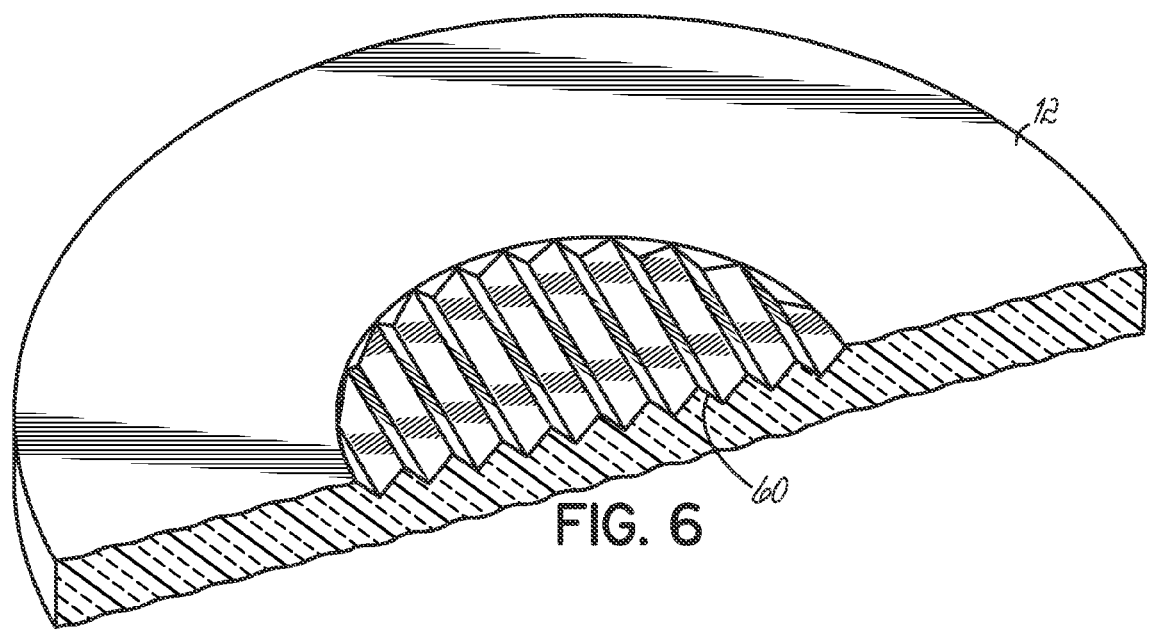

In addition or in the alternative to the above, it is proposed to reduce the heating power in the window 14 by decreasing the thickness of the film 15. The film can be decreased by increasing the surface area on the chamber side of the window. The total heating power would then be proportional to inverse area squared. Increasing the surface area of the window 14 on the chamber side can be achieved by creating a series of grooves 60 in the surface window 14, on the side facing the chamber. An example of this is the window 14 in FIG. 6. The grooves may be triangular, or should be more smoothly contoured. A height to base ratio of 0.85 will double the surface area of the window 14, and thus reduce the thickness of the film 15 by up to 50%. Triangular grooves are one example of grooves 50, but smoothly contoured grooves are generally preferable. Other shapes are also possible. The grooves 60 are preferably at right angles to the slots 18 in the baffle 16 to increase the lengths of the conductive paths that are formed by deposits that pass through the slots 18. The grooves 60 may be combined with the features 40 or 50 above or with a floating strip that shadows the window.

Figure 7:
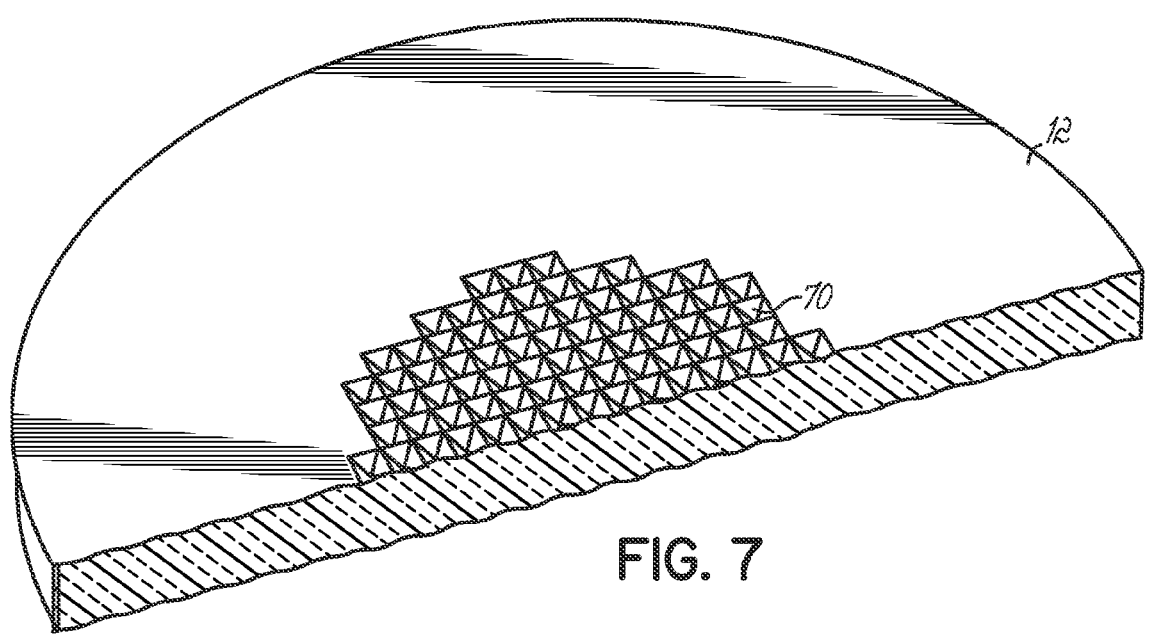

Another way of increasing the surface area of the window is to use an array pyramid-like features 70 as shown on FIG. 7. The features 70 can either project upwardly from or depress into the surface of the window. The features may be humps or depressions, and may be shapes other than pyramids. A rectangular array of these features or pyramids 70 can be fabricated by milling a grid of intersecting trenches similar to the grooves 60 on the chamber side of the window 14, intersecting at right angles. As in the case of grooves 60, a height to surface ratio of 0.85 will result in the doubling of the surface area. The increase in the area depends mainly on the ratio of the height to the base of the triangles or pyramid. Keeping the same angle, but changing the depth of the grooves has no effect. The main factors are machinability and cost.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A semiconductor wafer processing apparatus comprising:
    a vacuum processing chamber having a plasma processing space therein enclosed by a chamber wall having a dielectric window therein;
    a sputtering target in the processing chamber;
    a high-density plasma source coupled to the processing chamber through the dielectric window and including an RF coil having a coil axis in a first direction;
    a substrate support in the processing chamber facing the plasma processing space;
    a baffle having a plurality of slots therein mounted in the processing chamber between the plasma processing space and the dielectric window, the plurality of slots positioned in a direction that is parallel to the first direction;
    the dielectric window having an outside for facing toward the plasma source and a chamber side for facing the plasma processing space of the processing chamber through the baffle; and
    a projection formed on and extending diametrically across the chamber side of the dielectric window, the projection being substantially perpendicular to the plurality of slots of the baffle and having one or more overhangs thereon, the projection having a surface thereon that is shadowed from all line-of-site paths from the chamber through the slots of the baffle, the shadowed surface being dimensioned so as to diametrically interrupt the formation of a continuous film across a diameter of the dielectric window from a metallic material passing through the plurality of slots of the baffle.

2. A semiconductor wafer processing apparatus comprising:
    a vacuum processing chamber having a plasma processing space therein enclosed by a chamber wall having a dielectric window therein;
    a sputtering target in the processing chamber;
    a high-density plasma source coupled to the processing chamber through the dielectric window and including an RF coil having a coil axis in a first direction;
    a substrate support in the processing chamber facing the plasma processing space;
    a baffle having a plurality of slots therein mounted in the processing chamber between the plasma processing space and the dielectric window, the plurality of slots being positioned in a direction that is parallel to the first direction;
    the dielectric window having an outside for facing toward the plasma source and a chamber side for facing the plasma processing space of the processing chamber through the baffle; and
    a groove formed in and extending diametrically across the chamber side of the dielectric window, the groove being substantially perpendicular to the plurality of slots of the baffle and having one or more overhangs thereon, the groove having a surface therein that is shadowed from all line-of-site paths from the chamber through the slots of the baffle, the shadowed surface being dimensioned so as to diametrically interrupt the formation of a continuous film across a diameter of the dielectric window from a metallic material passing through the plurality of slots of the baffle.

* * * * *